(12) United States Patent
Maschera et al.

(10) Patent No.: US 12,431,844 B2
(45) Date of Patent: Sep. 30, 2025

(54) ANTENNA TUNING CIRCUIT FOR AN RFID TRANSPONDER

(71) Applicant: NXP B.V., Eindhoven (NL)

(72) Inventors: Davide Maschera, Lieboch (AT);
Lukas Zoescher, Graz (AT)

(73) Assignee: NXP B.V., Eindhoven (NL)

( * ) Notice: Subject to any disclaimer, the term of this patent is extended or adjusted under 35 U.S.C. 154(b) by 125 days.

(21) Appl. No.: 18/531,783

(22) Filed: Dec. 7, 2023

(65) Prior Publication Data
US 2025/0192723 A1    Jun. 12, 2025

(51) Int. Cl.
| H03F 1/02 | (2006.01) |
| H03F 3/45 | (2006.01) |
| H03H 7/38 | (2006.01) |
| H04B 5/43 | (2024.01) |
| H04B 5/45 | (2024.01) |

(52) U.S. Cl.
CPC ....... *H03F 1/0216* (2013.01); *H03F 3/45475* (2013.01); *H03H 7/38* (2013.01); *H03F 2200/451* (2013.01); *H04B 5/43* (2024.01); *H04B 5/45* (2024.01)

(58) Field of Classification Search
None
See application file for complete search history.

(56) References Cited

U.S. PATENT DOCUMENTS

| 7,167,090 B1 | 1/2007 | Mandal et al. |
| 10,929,734 B1 | 2/2021 | Hyde et al. |
| 2006/0238301 A1* | 10/2006 | Wu .......... H04B 5/266 340/10.1 |
| 2009/0291635 A1* | 11/2009 | Savry ........... G06K 7/0008 455/73 |
| 2013/0215979 A1* | 8/2013 | Yakovlev .......... H04B 5/45 375/256 |
| 2016/0173030 A1 | 6/2016 | Langer et al. |
| 2019/0074914 A1* | 3/2019 | Hueber ............. H04B 5/24 |
| 2021/0184728 A1* | 6/2021 | Kang .............. H04B 5/48 |
| 2021/0294993 A1* | 9/2021 | Sundaresan ........ H04B 5/45 |

(Continued)

FOREIGN PATENT DOCUMENTS

WO    WO-2016034893 A1    3/2016

OTHER PUBLICATIONS

Bakhtiar, A., "An RF Power Harvesting System with Input-Tuning for Long-Range RFID Tags", IEEE International Symposium on Circuits and Systems, May 30, 2010-Jun. 2, 2010.

*Primary Examiner* — Wilson Lee

(57) ABSTRACT

An antenna tuning circuit is provided. The antenna tuning circuit includes an envelope detector, an operational amplifier, and a switch. The envelope detector is configured to track an envelope of a signal received at an antenna terminal. The operational amplifier includes a first input coupled to an output of the envelope detector to receive a first signal and a second input coupled to receive a second signal and is configured to generate an output signal at an output based on the first signal and the second signal. The switch includes a first terminal coupled to the output of the operational amplifier, a second terminal coupled to the second input of the operational amplifier, and a control terminal coupled to receive a first control signal. The operational amplifier is configured in a follower configuration when the first control signal is at a first voltage value.

20 Claims, 5 Drawing Sheets

(56) References Cited

U.S. PATENT DOCUMENTS

2024/0422773 A1* 12/2024 Gupta .................. H04W 4/80
2025/0165739 A1*  5/2025 De la Cruz Marin ......................
                                                    G06K 19/0715

* cited by examiner

ANTENNA TUNING CIRCUIT FOR AN RFID TRANSPONDER

BACKGROUND

Field

This disclosure relates generally to electronic circuits, and more specifically, to an antenna tuning circuit for radio frequency identification (RFID) transponders.

Related Art

Ultra-high frequency (UHF) RFID transponders, commonly referred to as RFID tags, are widely used to identify objects to which the tags are attached. The most common application examples of RFID tags are retail, supply chain management, shipping services, airline luggage tracking, laundry services, etc. An RFID tag typically includes an antenna and an integrated circuit. In such configurations, the integrated circuit is powered by voltage derived from a received RF signal. An RFID transponder may communicate with an RFID reader via an electrical, magnetic, or electromagnetic field generated by the RFID reader. It is therefore desirable to provide an efficient power conversion from RF signals.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an antenna tuning circuit for a UHF RFID transponder that includes an antenna tuning impedance circuit, envelope detector circuit, antenna tuning detector circuit, and antenna tuning control circuit. The antenna tuning impedance circuit includes an adjustable impedance to adjust an impedance coupled to the antenna terminals of the RFID transponder. The envelope detector provides an envelope signal that tracks a voltage envelope of a signal received at an antenna. The antenna tuning control provides a first control signal to control the antenna tuning detector and provides a second control signal or a control signal bus to configure the antenna tuning impedance circuit. The antenna tuning control includes digital circuitry to execute a procedure to apply in sequential steps different configurations of the antenna tuning impedance. The antenna tuning detector includes an operational amplifier that is configured in a follower configuration during a first phase of an applied tuning impedance configuration and configured in a comparator configuration during a second phase of changed applied tuning impedance configuration. The antenna tuning controller includes clock-based circuitry and provides a first control signal to configure the operation amplifier. The antenna tuning detector samples the voltage of the envelop signal during the first phase. During the second phase, the antenna tuning detector compares a present voltage of the envelop signal with the previously sampled voltage of the envelop signal and provides a digital output signal. Based on the digital output signal, the antenna tuning controller determines the antenna tuning impedance configuration to be applied in the next sequential step. In this manner, automatic adjustments to the impedance matching between the antenna and the frontend circuit of the RFID transponder to optimize the power transfer to the frontend circuitry can be realized.

Figure 1:
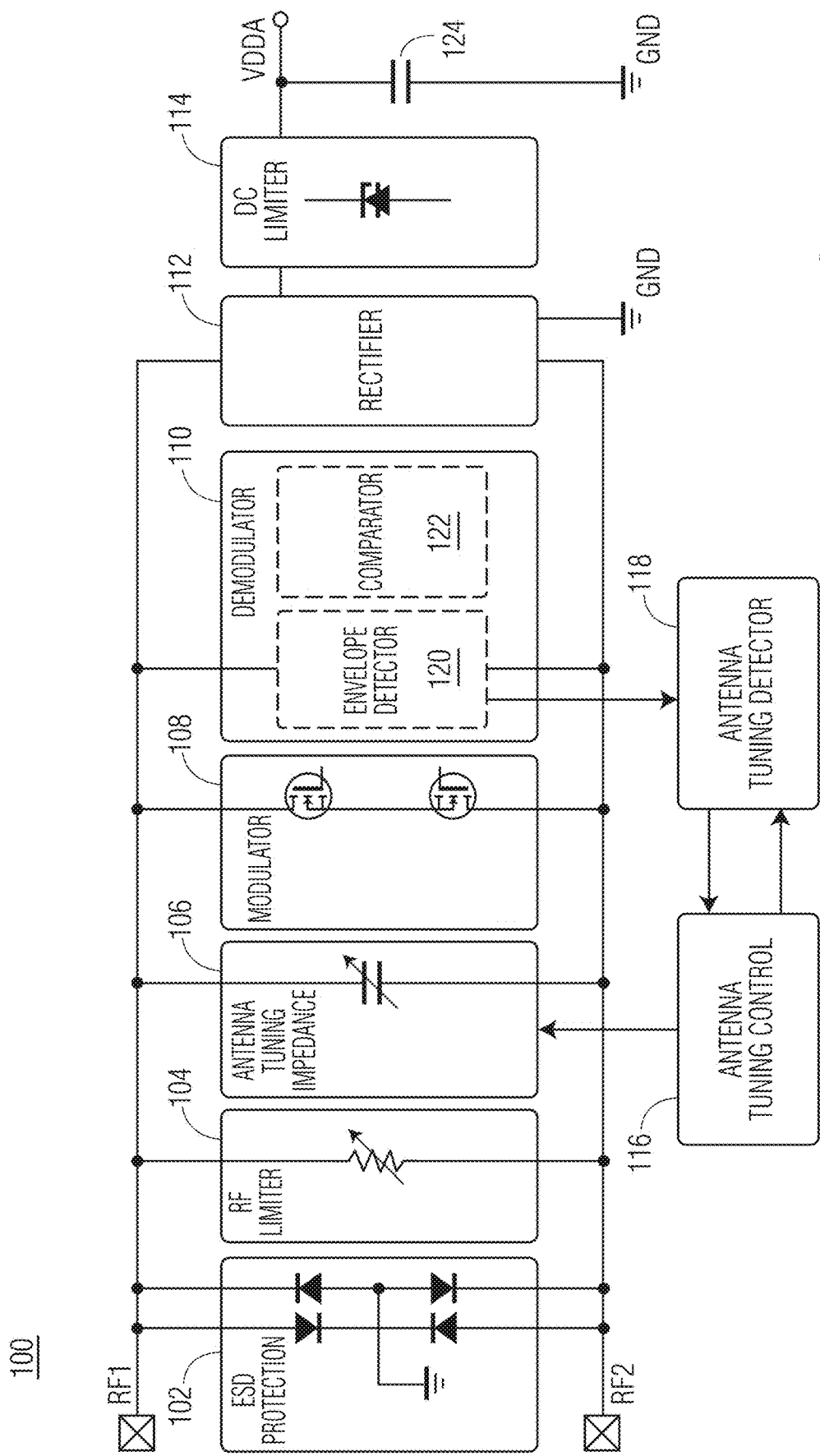
FIG. 1 illustrates, in simplified block diagram form, an example ultra-high frequency (UHF) RFID frontend with an antenna tuning circuit in accordance with an embodiment.

FIG. 1 illustrates, in simplified block diagram form, an example ultra-high frequency (UHF) RFID frontend 100 with an antenna tuning circuit in accordance with an embodiment. In this embodiment, the example RFID frontend 100 is implemented in one or more complementary metal-oxide semiconductor (CMOS) integrated circuits. The RFID frontend 100 includes an electrostatic discharge (ESD) protection circuit 102, an RF limiter circuit 104, an antenna tuning impedance circuit 106, a modulator circuit 108, a demodulator circuit 110, a rectifier circuit 112, a DC limiter circuit 114, and a buffer capacitor 124. The demodulator circuit 110 includes an envelope detector circuit 120 and a comparator circuit indicated by dashed outlines. In this embodiment, the RFID frontend 100 further includes an antenna tuning control circuit 116 and an antenna tuning detector circuit 118.

The ESD protection circuit 102, RF limiter circuit 104, antenna tuning impedance circuit 106, modulator circuit 108, envelope detector circuit 120 of the demodulator circuit 110, and rectifier circuit 112 are coupled to differential antenna terminals RF1 and RF2. An antenna (not shown) is connected to the respective antenna terminals RF1 and RF2. The DC limiter circuit 114 includes an input connected to an output of the rectifier circuit 112, and an output connected to a power supply voltage terminal labeled VDDA. The buffer capacitor 124 includes a first terminal connected to VDDA and a second terminal connected to a ground voltage terminal labeled GND. In this embodiment, the antenna tuning detector circuit 118 is coupled to the envelope detector circuit 120 of the demodulator circuit 110 and the antenna tuning control circuit 116 is coupled to the antenna tuning impedance circuit 106.

The rectifier circuit 112 is configured to provide transformation of the received RF voltage from the antenna connected at the antenna terminals RF1 and RF2 to provide a DC supply voltage for circuits of an integrated circuit (IC) (e.g., digital logic, non-volatile memory). The modulator circuit 108 is configured to provide modulation of an input impedance to modulate the signal that is scattered back from the antenna to transmit information to a reader, for example. The demodulator circuit 110 is configured to provide demodulation of an amplitude modulated signal transmitted by a reader and received at the antenna connected to antenna terminals RF1 and RF2, for example. The antenna tuning impedance circuit 106 is configured to provide tuning of the input impedance (e.g., tunable capacitance) to maximize the power transfer from the antenna to the chip input.

In this embodiment, the antenna tuning control circuit 116 is configured to control the execution of an antenna tuning procedure to adjust impedance settings by way of control signal(s) provided to the antenna tuning impedance circuit 106. The antenna tuning control circuit 116 may be implemented as a digital logic circuit block, for example. The antenna tuning detector circuit 118 is configured to detect changes of the RF voltage amplitude in response to adjustments of the tuning impedance by the antenna tuning control circuit 116. An output of the antenna tuning detector circuit 118 provides an indication to the antenna tuning control circuit 116 whether an applied impedance adjustment improved the power transfer.

The electrostatic discharge protection circuit 102 may be implemented in various ways. One example implementation of ESD protection circuit 102 includes anti-parallel pn-junction diodes. The anti-parallel diodes are configured to provide a path for high currents generated by an electrostatic discharge event at the antenna terminals that may otherwise damage circuits on the integrated circuit. The DC limiter circuit 114 is configured to regulate and limit the output voltage of the rectifier circuit 112.

The number of circuit blocks, arrangement, connectivity, and symbols within these circuit blocks of the RFID frontend 100 are chosen for illustration purposes. Note that even though a differential RFID frontend implementation is depicted in FIG. 1 and described, a single-ended frontend implementation may be provided in which either terminal RF1 and RF2 corresponds to the IC ground.

Figure 2:
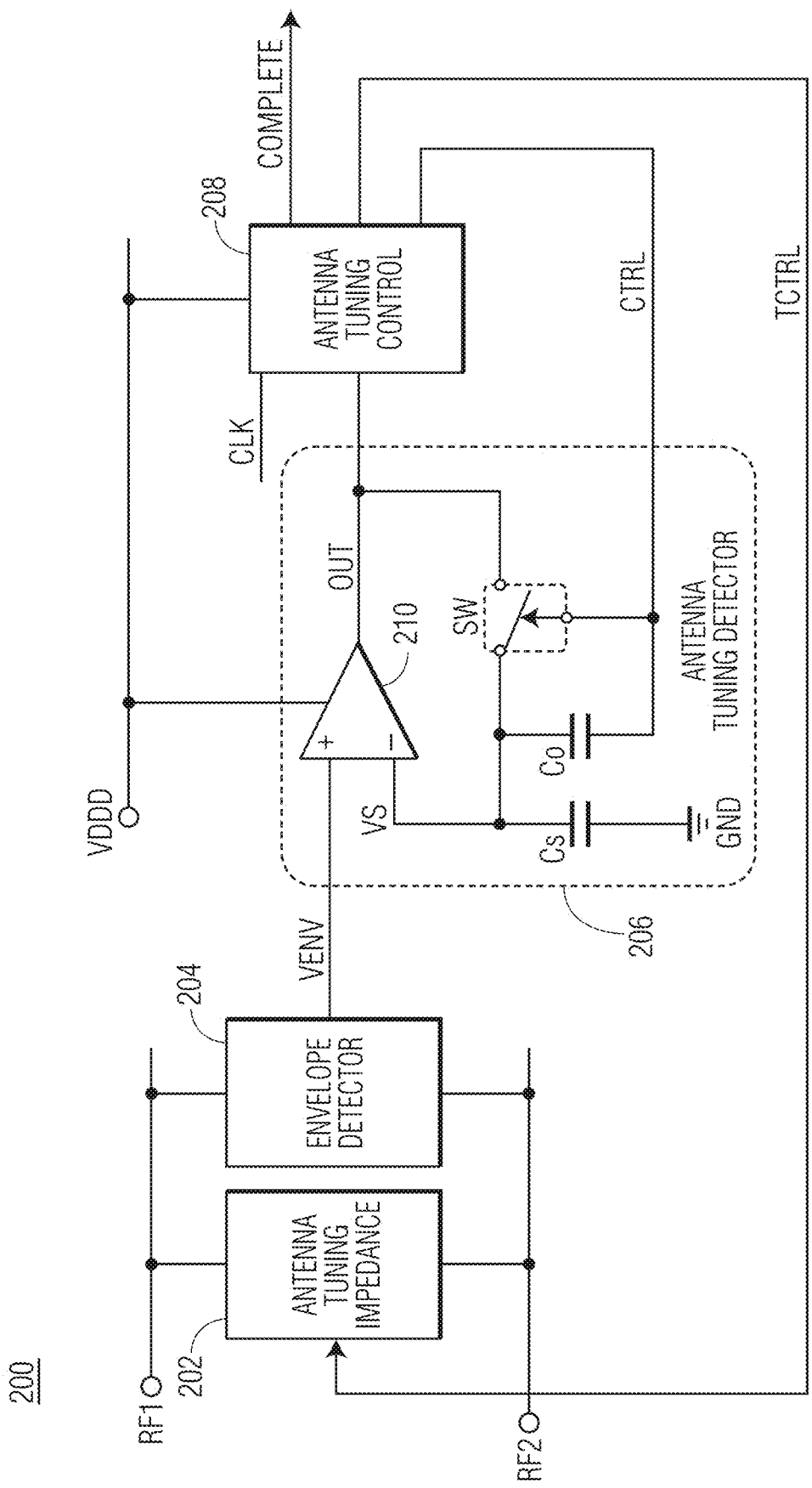
FIG. 2 illustrates, in simplified schematic diagram form, an example antenna tuning circuit in accordance with an embodiment.

FIG. 2 illustrates, in simplified schematic diagram form, an example of an antenna tuning circuit 200 of the RFID frontend 100 in accordance with an embodiment. The antenna tuning circuit 200 includes antenna tuning impedance circuit 202, envelope detector circuit 204, antenna tuning detector circuit 206, and antenna tuning control circuit 208. In this embodiment, the antenna tuning impedance circuit 202, envelope detector circuit 204, antenna tuning detector circuit 206, and antenna tuning control circuit 208 of the antenna tuning circuit 200 correspond to the antenna tuning impedance circuit 106, envelope detector circuit 120, antenna tuning detector circuit 118, and antenna tuning control circuit 116 of the RFID frontend 100 depicted in FIG. 1.

The antenna tuning impedance circuit 202 includes an impedance matching network coupled to the antenna terminals RF1 and RF2 and has an input coupled to receive tuning control signal labeled TCTRL from the antenna tuning control circuit 208. The antenna tuning impedance circuit 202, for example, has selectable load capacitance for adjusting (e.g., tuning) impedance across the antenna terminals RF1 and RF2. The tunable impedance of the antenna tuning impedance circuit 202 is controlled by way to the tuning control signal TCTRL. The RF input voltage amplitude is maximized by way of tuning the impedance coupled to the antenna terminals RF1 and RF2.

The envelope detector circuit 204 is coupled to the antenna terminals RF1 and RF2 and configured to provide at an output envelope signal labeled VENV that tracks the voltage envelope of the differential RF voltage at the antenna terminals RF1 and RF2. The output envelope signal VENV of the envelope detector circuit 204 is based on the extracted voltage envelope of the received RF voltage signal at RF1 and RF2.

In this embodiment, an example implementation of the antenna tuning detector circuit 206 includes an operational amplifier 210, a switch labeled SW, a sample capacitor Cs, and an offset capacitor Co. The operational amplifier 210 includes a non-inverting (+) input coupled to the output of the envelope detector circuit 204, an inverting input (−) coupled to a first terminal capacitor Cs, a first terminal of capacitor Co, and a first terminal of switch SW at node labeled VS, and an output labeled OUT coupled to an input of the antenna tuning control circuit 208 to provide an output signal OUT. A second terminal of the capacitor Cs is coupled to the ground terminal GND and a second terminal of the switch SW is coupled at the output OUT. A second terminal of the capacitor Co is coupled to a control terminal of the switch SW at node labeled CTRL. The second terminal of the capacitor Co and the control terminal of the switch SW are coupled to receive control signal labeled CTRL from the antenna tuning control circuit 208.

The antenna tuning control circuit 208 has a first input to receive a clock signal labeled CLK, a second input to receive the OUT signal from the operational amplifier 210, a first output for providing the control signal CTRL, a second output for providing the tuning control signal TCTRL, and a third output for providing a completion signal labeled COMPLETE. The operational amplifier 210 has an input connected to a digital power supply voltage terminal labeled VDDD and the ground terminal GND (not shown). Likewise, the antenna tuning control circuit 208 has an input connected to the digital power supply voltage terminal VDDD and the ground terminal GND (not shown).

The antenna tuning control circuit 208 includes clocked logic implementing an auto-tuning sequence based on phase of operation. The tuning control circuit 208 is configured to generate the control signal CTRL and the tuning control signal TCTRL based on the output signal OUT of the operational amplifier 210. In a first (e.g., sample) phase of operation, the antenna tuning control circuit 208 configures the operational amplifier 210 in a "follower" configuration by way of the control signal CTRL at a first state (e.g., CTRL=GND). In a second (e.g., hold) phase of operation, the antenna tuning control circuit 208 configures the operational amplifier 210 in a "comparator" configuration by way of the control signal CTRL at a second state (e.g., CTRL=VDDD).

In the follower configuration, the switch SW is closed connecting the output OUT to the node VS allowing the voltage at the output OUT to substantially equal the voltage of the VENV signal. For example, the voltage at the output OUT may be equal to a first voltage of the VENV signal VENV0 minus an offset voltage VOS (e.g., offset voltage of the operational amplifier, approximately 10-20 millivolts). The voltage (VS) at the node VS coupled to the output OUT may be represented as VS=VENV0−VOS. Accordingly, each of the capacitors Cs and Co are charged to the voltage level of the output OUT and VS.

In the comparator configuration, the switch is opened and the VDDD voltage is applied to the second terminal of the capacitor Co. Therefore, a delta voltage ΔV equal to VDDD*Co/Cs is injected at node VS. The antenna tuning control circuit 208 applies a next configuration of the antenna tuning impedance according to an antenna tuning procedure by way of tuning control signal TCTRL. The tuning control signal TCTRL may be implemented as a plurality of signal lines, for example. The operational amplifier 210 is configured to generate the output signal OUT as a logic value (e.g., logic 0 or logic 1) by comparing a second voltage VENV1 of the VENV signal with the voltage of the VS signal at the node VS. It should be noted that the VENV1 voltage may be different from VENV0 voltage as a result of a changed antenna tuning impedance configuration. The VS voltage serves as a reference voltage for the comparator function of the operational amplifier 210 in the comparator configuration. In this embodiment, the VS voltage is approximately equal to the sampled first envelope detector voltage VENV0 minus the offset voltage VOS plus ΔV which is equal to VDDD voltage multiplied by the ratio of Co to Cs (i.e., VDDD*Co/Cs). The antenna tuning control circuit 208 receives the logic value of the OUT signal and determines whether the applied antenna tuning impedance configuration has resulted in a sufficient increase of VENV. An increase in VENV corresponds to an increased power transfer from the antenna to the RFID frontend circuit as a result of an improved impedance matching between antenna and RFID frontend circuit or RFID transponder.

The auto-tuning sequence of the antenna tuning control circuit 208 continues by adjusting the impedance coupled to the antenna terminals RF1 and RF2 and alternating sample and hold phases. By monitoring successive output envelope signal VENV voltage values for each impedance adjustment, an optimum (e.g., maximum) RF voltage amplitude is identified and set. After the optimum voltage amplitude is set, the antenna tuning control circuit 208 provides an indication that the auto-tuning is complete by way of the completion signal COMPLETE.

Figure 3B:
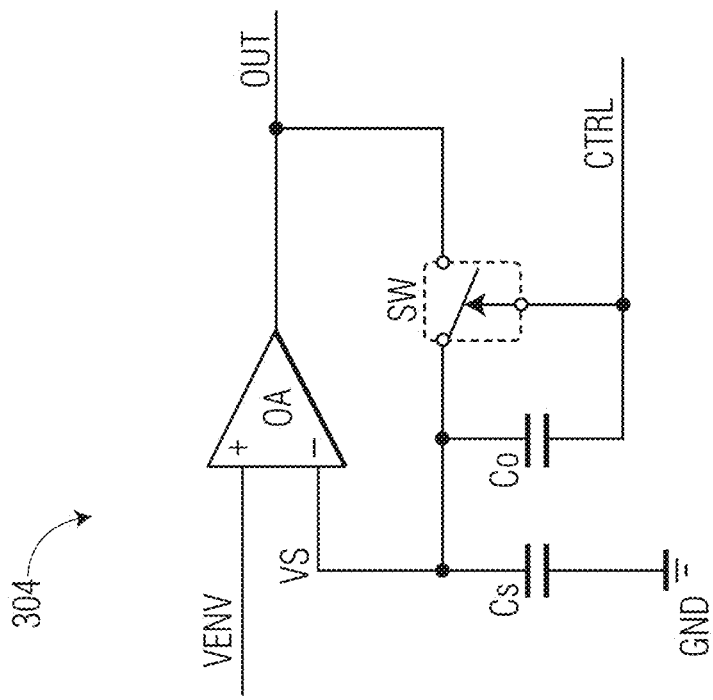
FIG. 3A and FIG. 3B illustrate, in simplified schematic diagram form, circuitry of the example an antenna tuning detector at phases of operation in accordance with an embodiment.
Figure 3A:
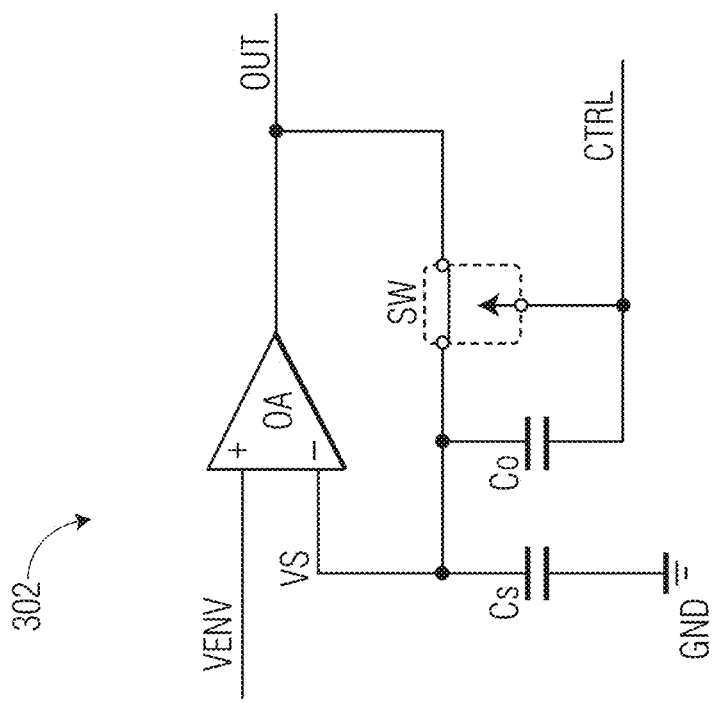

FIG. 3A illustrates, in simplified schematic diagram form, the antenna tuning detector 206 of FIG. 2 configured in a follower configuration 302 in accordance with an embodiment. The antenna tuning detector follower configuration 302 includes operational amplifier OA, switch SW configured in a closed state, sample capacitor Cs, and offset capacitor Co. The operational amplifier OA includes the non-inverting (+) input coupled to receive the VENV envelope signal, inverting input (−) coupled to the first terminal of capacitor Cs, the first terminal of capacitor Co, and to the output OUT by way of the closed switch SW. The second terminal of the capacitor Cs is coupled to the ground terminal GND and the second terminal of the capacitor Co is coupled to the control terminal of the switch SW at node CTRL. The second terminal of the capacitor Co and the control terminal of the switch SW are coupled to receive the CTRL control signal (e.g., GND).

In the follower configuration 302, the switch SW is closed forming a conductive path from the output OUT to the node VS. With the switch SW closed, the operational amplifier OA is essentially in a unity gain configuration allowing the voltage at the output OUT to be substantially equal to a first voltage VENV0 of the VENV signal minus an offset voltage VOS. As a result, each of the capacitors Cs and Co are charged to the voltage level of the OUT signal while in the follower configuration 302. Corresponding follower configuration sample waveforms of the VENV, VS, OUT, and CTRL signals are illustrated in phase 0 of FIG. 4.

FIG. 3B illustrates, in simplified schematic diagram form, the antenna tuning detector 206 of FIG. 2 configured in a comparator configuration 304 in accordance with an embodiment. The antenna tuning detector comparator configuration 304 includes operational amplifier OA, switch SW configured in an open state, sample capacitor Cs, and offset capacitor Co. The operational amplifier OA includes the non-inverting (+) input coupled to receive the VENV envelope signal, inverting input (−) coupled to the first terminal of capacitor Cs and the first terminal of capacitor Co. The second terminal of the capacitor Cs is coupled to the ground terminal GND and the second terminal of the capacitor Co is coupled to the control terminal of the switch SW at node CTRL. The second terminal of the capacitor Co and the control terminal of the switch SW are coupled to receive the CTRL control signal (e.g., VDDD).

In the comparator configuration 304, the output OUT is isolated from node VS by way of the opened switch SW and the VDDD voltage is applied to the second terminal of the capacitor Co. The operational amplifier OA is configured to compare a second voltage VENV1 of the VENV signal with the voltage of the VS signal at the node VS and provide a logic value at the output OUT. The VS voltage serves as a reference voltage for the comparator function of the operational amplifier OA in the comparator configuration. In this embodiment, the VS voltage is boosted by a delta voltage ΔV (e.g., ΔV of approximately 10 millivolts) by injecting the charge stored in the capacitor Co such that the resulting VS voltage is approximately equal to VENV0 minus the offset voltage VOS plus VDDD*Co/Cs when the control signal CTRL transitions from the GND voltage to the VDDD voltage. Corresponding comparator configuration sample waveforms of the VENV, VS, OUT, and CTRL signals are illustrated in phase 1 of FIG. 4.

Figure 4:
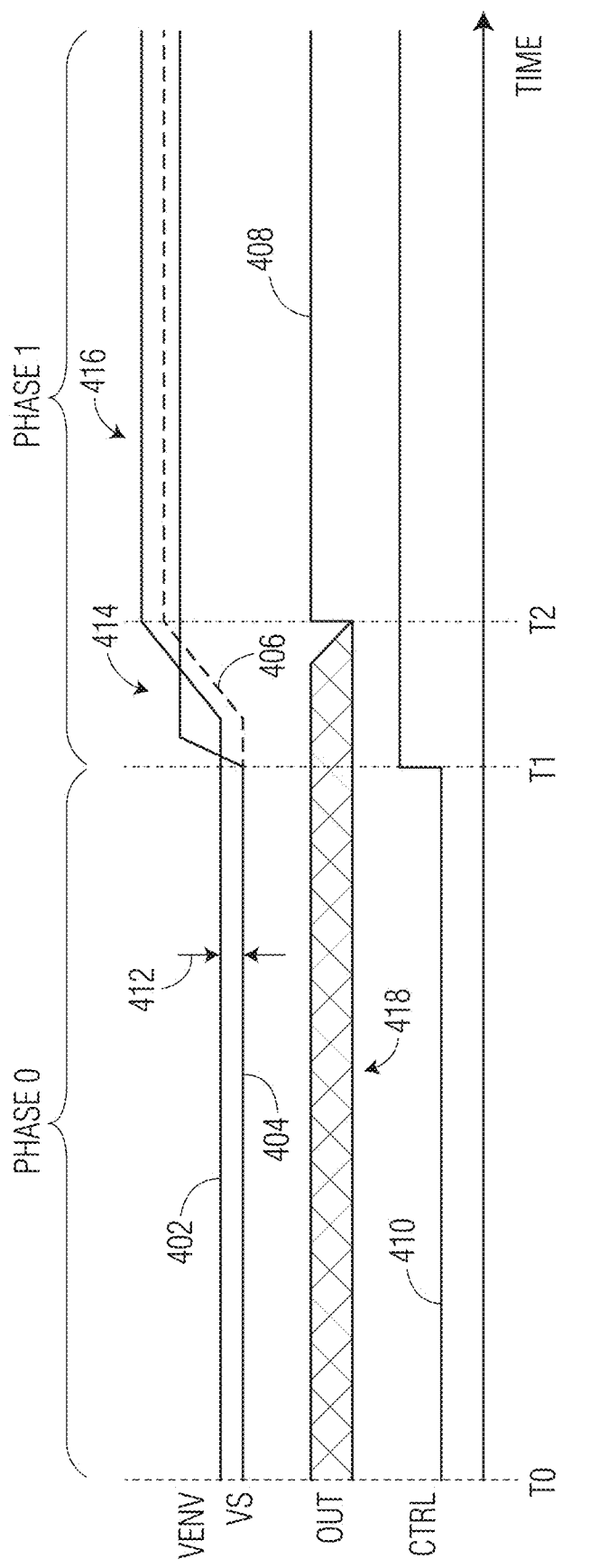
FIG. 4 illustrates, in simplified plot diagram form, example signal waveforms of the antenna tuning detector circuitry depicted in FIG. 3A and FIG. 3B in accordance with an embodiment.

FIG. 4 illustrates, in simplified plot diagram form, example signal waveforms of the antenna tuning detector circuitry depicted in FIG. 3A and FIG. 3B in accordance with an embodiment. The plot diagram of FIG. 4 includes a VENV voltage signal waveform 402, a VS voltage signal waveform 404, and an OUT signal waveform 408 corresponding to the respective input and output signals of the operational amplifier OA FIG. 3A and FIG. 3B. The plot diagram of FIG. 4 further includes a CTRL control signal waveform 410 of the antenna tuning detector circuitry depicted in FIG. 3A and FIG. 3B. Example signal waveforms of the antenna tuning detector circuitry are shown versus TIME on the X-axis. By way of example, basic operation of the antenna tuning detector circuitry is depicted in the following.

At time T0, the antenna tuning detector circuitry is in a first phase of operation labeled PHASE 0. In this phase, the VENV, VS, OUT, and CTRL waveforms correspond to the circuit configuration depicted in FIG. 3A with the operational amplifier OA configured in the follower configuration. The control signal CTRL is at a logic 0 level (e.g., GND) which configures the operation amplifier OA in the follower configuration. The VENV voltage level minus offset voltage VOS 412 is provided to the VS node. The PHASE 0 phase may be characterized as a sample phase in which the voltage level at the VS node is sampled by way of charging the Cs and Co capacitors to the VS node voltage. The OUT signal waveform 408 includes a non-valid region 418 (e.g., depicted as a crossed-hatch region) from a logic level perspective. In other words, the OUT signal is essentially an analog signal during PHASE 0 and not necessarily indicative of a logic value. In the period from time T0 to time T1, the VENV voltage is at a first voltage level VENV0.

At time T1, the CTRL control signal transitions from a logic 0 level to a logic 1 level (e.g., VDDD) and the antenna tuning detector circuitry enters a second phase of operation labeled PHASE 1. In this phase, the VENV, VS, OUT, and CTRL waveforms correspond to the circuit configuration depicted in FIG. 3B with the operational amplifier OA configured in the comparator configuration. The transition of the CTRL control signal to the logic 1 level configures the operation amplifier OA in the comparator configuration by way of opening the switch SW. The transition from GND to VDDD at the second terminal of the capacitor Co causes the Co stored charge to be injected at the VS node such that the VS voltage 404 transitions to a boosted VS voltage level 414 approximately equal to VENV0 minus the offset voltage VOS plus VDDD*Co/Cs. The PHASE 1 phase may be characterized as a hold phase in which the boosted VS voltage level 414 at the VS node is held at approximately VENV0 minus the offset VOS plus ΔV until the next sample phase, for example. The VENV voltage level minus the offset voltage VOS 412 is shown as a dashed line 406 for reference.

At time T2, the antenna tuning detector circuitry is at the PHASE 1 phase of operation. In the period from time T1 to time T2, the VENV voltage transitions to a second voltage level VENV1 416 in response to a tuning step adjustment to the tunable impedance of the antenna tuning impedance circuit in this embodiment. At time T2, the VENV voltage 416 exceeds the boosted VS voltage 414 by an amount sufficient to cause the OUT signal of the comparator function to transition to a logic 1 level. In this embodiment, the OUT signal at the logic 1 level provides an indication to the antenna tuning control circuit that the tuning step adjustment to the tunable impedance of the antenna tuning circuit generated an improved RF input voltage amplitude.

Figure 5:
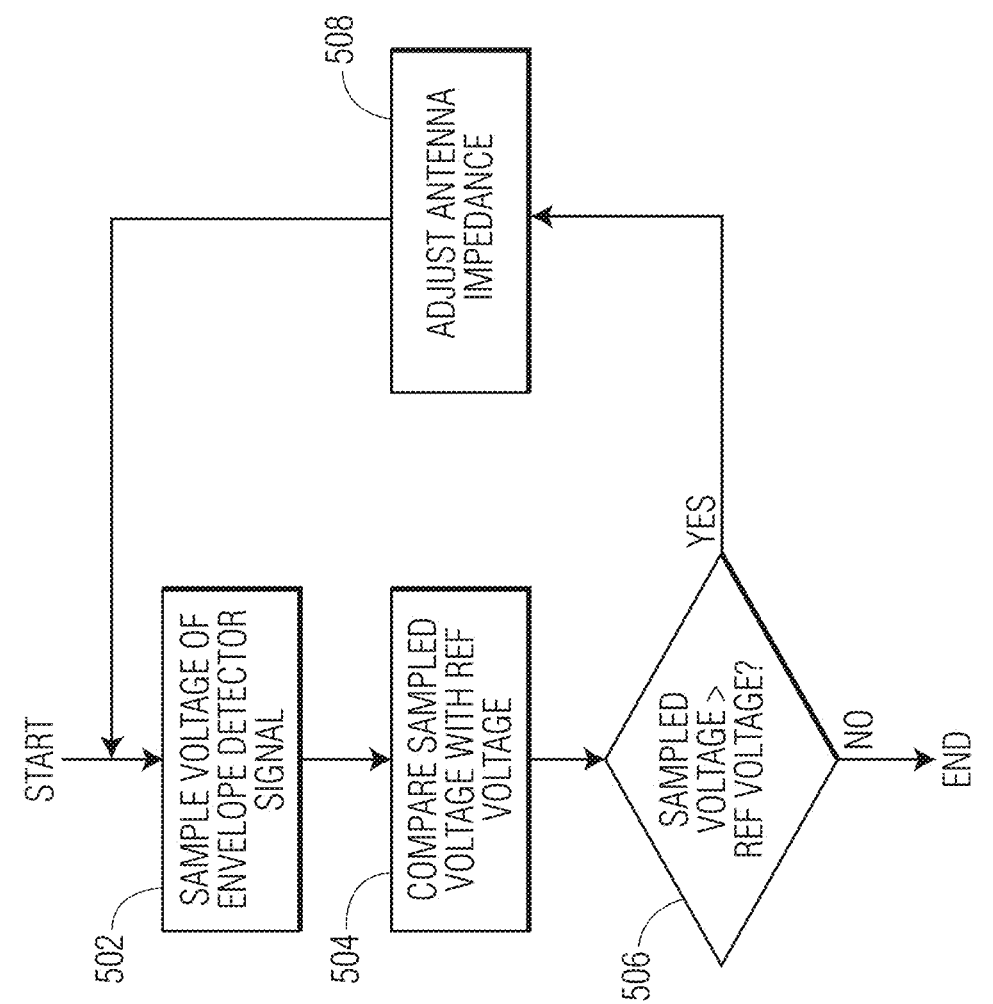
FIG. 5 illustrates, in simplified flow diagram form, an example method for antenna tuning in accordance with an embodiment.

FIG. 5 illustrates, in simplified flow diagram form, an example method for antenna tuning in accordance with an embodiment. The example antenna auto-tuning method 500 corresponds to the example antenna tuning circuit 200 of the RFID frontend 100 depicted in FIG. 2.

At step 502, sample voltage of envelope detector signal. At this step, a first voltage VENV0 of the VENV voltage signal from the envelope detector circuit 204 at a first antenna tuning state is sampled by way of the antenna tuning detector 206 configured in the follower configuration. In the follower configuration, the first voltage VENV0 of the VENV voltage signal (e.g., minus an intrinsic offset voltage of the operational amplifier) is provided as a voltage VSO to the VS node and stored on the Cs and Co capacitors.

At step 504, compare sampled voltage with reference voltage. At this step, the antenna tuning detector 206 is configured in the comparator configuration. In the comparator configuration, a second voltage VENV1 of the VENV voltage signal at the non-inverting input (+) is compared with the VSO voltage plus ΔV at the inverting (e.g., reference) input (−). When the VENV1 voltage is greater than the VSO voltage plus ΔV, the OUT signal transitions to a logic high level (e.g., logic 1 level, VDDD), for example. The predetermined threshold ΔV is generated by the transition of the control signal CTRL from logic 0 to logic 1 level applied to the capacitor Co.

At step 506, determine whether the sampled voltage is greater than the reference voltage (e.g., VS voltage). If the VENV1 voltage is not greater than the VSO voltage plus ΔV (reference) voltage, then (NO) the optimal antenna tuning impedance state has been reached and the antenna tuning procedure is completed. If the VENV1 voltage is greater than the VSO voltage plus ΔV (reference) voltage, then (YES) the optimal antenna tuning impedance state has not been reached and the antenna tuning procedure continues at step 508.

At step 508, adjust antenna impedance. At this step, an antenna tuning impedance state is applied by the antenna tuning control circuit to the antenna tuning impedance circuit 202 by way of the TCTRL signal. The antenna tuning control circuit 208 provides the TCTRL tuning control signal based on the OUT signal of the operational amplifier in the comparator configuration. After the antenna tuning impedance state is applied to adjust the impedance of the antenna tuning impedance circuit, the flow continues at step 502 where the voltage of the envelope detector signal is sampled again.

Generally, there is provided, an antenna tuning circuit for radio frequency identification (RFID) transponders including an envelope detector having an input coupled to an antenna terminal, the envelope detector configured to track an envelope of a signal received at the antenna terminal, the envelope detector having an output for providing a first signal; an operational amplifier having a first input coupled to the output of the envelope detector to receive the first signal and a second input coupled to receive a second signal, the operational amplifier configured to generate an output signal at an output based on the first signal and the second signal; a switch having a first terminal coupled to the output of the operational amplifier, a second terminal coupled to the second input of the operational amplifier, and a control terminal coupled to receive a first control signal, wherein the operational amplifier is configured in a follower configuration when the first control signal is at a first voltage value. The operational amplifier may be further configured in a comparator configuration when the first control signal is at a second voltage value. The antenna tuning circuit may be configured in a sample phase when the first control signal is at the first voltage value and configured in a hold phase when the first control signal is at the second voltage value. The antenna tuning circuit may further include a first capacitor having a first terminal coupled at the second input of the operational amplifier, and a second terminal coupled at a ground terminal; and a second capacitor having a first terminal coupled at the second input of the operational amplifier, and a second terminal coupled to receive the first control signal. The second capacitor may be configured to store a voltage; and inject stored charge at the second input of the operational amplifier when the first control signal transitions from the first voltage value to the second voltage value. The antenna tuning circuit may further include a tuning control circuit having an input coupled to the output of the operational amplifier, the tuning control circuit configured to generate the first control signal at a first output based on the output signal of the operational amplifier. The tuning control circuit may be further configured to generate a second control signal at a second output based on the output signal of the operational amplifier, the second control signal configured for adjustment of impedance at the antenna terminal. The antenna tuning circuit may further include a matching network coupled to the antenna terminal, the matching network configured to adjust impedance at the antenna terminal in response to the second control signal. The output signal at the output of the operational amplifier may be characterized as logically invalid when the first control signal is at the first voltage value.

In another embodiment, there is provided, a method including tracking an envelope of a radio frequency signal received at an antenna terminal to produce a first signal; sampling a first voltage of the first signal by way of an operational amplifier in a first configuration; comparing the first voltage of the first signal with a reference voltage by way of the operational amplifier in a second configuration; and adjusting impedance at the antenna terminal based on the comparison of the first voltage of the first signal with the reference voltage. The method may further include generating a first control signal based on an output logic value of the operational amplifier in the second configuration, the impedance at the antenna terminal adjusted by way of the first control signal. The method may further include controlling a switch by way of a second control signal, the operational amplifier configured in the first configuration in response to the second control signal at a first state and in the second configuration in response to the second control signal at a second state. The first configuration of the operational amplifier may be characterized as a follower configuration and the second configuration of the operational amplifier is characterized as a comparator configuration. The method may further include storing the first voltage by way of a first capacitor coupled at a first input of the operational amplifier in the first configuration; and injecting stored charge corresponding to an offset voltage by way of a second capacitor coupled at the first input of the operational amplifier in the second configuration. The offset voltage may be proportional to the ratio of the second capacitor capacitance to the first capacitor capacitance.

In yet another embodiment, there is provided, an antenna tuning circuit for radio frequency identification (RFID) transponders including an envelope detector having an input coupled to an antenna terminal, the envelope detector configured to track an envelope of a signal received at the antenna terminal, the envelope detector having an output for providing a first signal; an operational amplifier having a first input coupled to the output of the envelope detector to receive the first signal and a second input coupled to receive a second signal, the operational amplifier configured to generate an output signal at an output based on the first signal and the second signal; a switch having a first terminal coupled to the output of the operational amplifier, a second terminal coupled to the second input of the operational amplifier, and a control terminal coupled to receive a first control signal, wherein the operational amplifier is configured in a follower configuration when the first control signal is at a first voltage value and configured in a comparator configuration when the first control signal is at a second voltage value; and a tuning control circuit having an input coupled to the output of the operational amplifier, the tuning control circuit configured to generate the first control signal at a first output based on the output signal of the operational amplifier. The tuning control circuit may be further configured to generate a second control signal at a second output based on the output signal of the operational amplifier, the second control signal configured for adjustment of impedance at the antenna terminal. The antenna tuning circuit may be configured in a sample phase when the first control signal is at the first voltage value and configured in a hold phase when the first control signal is at the second voltage value. The antenna tuning circuit may further include a first capacitor having a first terminal coupled at the second input of the operational amplifier, and a second terminal coupled at a ground terminal; and a second capacitor having a first terminal coupled at the second input of the operational amplifier, and a second terminal coupled to receive the first control signal. The second capacitor may be configured to store a voltage; and inject stored charge at the second input of the operational amplifier when the first control signal transitions from the first voltage value to the second voltage value.

By now it should be appreciated that there has been provided, an antenna tuning circuit for a UHF RFID transponder that includes an antenna tuning impedance circuit, envelope detector circuit, antenna tuning detector circuit, and antenna tuning control circuit. The antenna tuning impedance circuit includes an adjustable impedance to adjust an impedance coupled to the antenna terminals of the RFID transponder. The envelope detector provides an envelope signal that tracks a voltage envelope of a signal received at an antenna. The antenna tuning control provides a first control signal to control the antenna tuning detector and provides a second control signal or a control signal bus to configure the antenna tuning impedance circuit. The antenna tuning control includes digital circuitry to execute a procedure to apply in sequential steps different configurations of the antenna tuning impedance. The antenna tuning detector includes an operational amplifier that is configured in a follower configuration during a first phase of an applied tuning impedance configuration and configured in a comparator configuration during a second phase of changed applied tuning impedance configuration. The antenna tuning controller includes clock-based circuitry and provides a first control signal to configure the operation amplifier. The antenna tuning detector samples the voltage of the envelop signal during the first phase. During the second phase, the antenna tuning detector compares a present voltage of the envelop signal with the previously sampled voltage of the envelop signal and provides a digital output signal. Based on the digital output signal, the antenna tuning controller determines the antenna tuning impedance configuration to be applied in the next sequential step. In this manner, automatic adjustments to the impedance matching between the antenna and the frontend circuit of the RFID transponder to optimize the power transfer to the frontend circuitry can be realized.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An antenna tuning circuit for radio frequency identification (RFID) transponders, the antenna tuning circuit comprising:
   an envelope detector having an input coupled to an antenna terminal, the envelope detector configured to track an envelope of a signal received at the antenna terminal, the envelope detector having an output for providing a first signal;

an operational amplifier having a first input coupled to the output of the envelope detector to receive the first signal and a second input coupled to receive a second signal, the operational amplifier configured to generate an output signal at an output based on the first signal and the second signal;

a switch having a first terminal coupled to the output of the operational amplifier, a second terminal coupled to the second input of the operational amplifier, and a control terminal coupled to receive a first control signal, wherein the operational amplifier is configured in a follower configuration when the first control signal is at a first voltage value.

2. The antenna tuning circuit of claim 1, wherein the operational amplifier is further configured in a comparator configuration when the first control signal is at a second voltage value.

3. The antenna tuning circuit of claim 2, wherein the antenna tuning circuit is configured in a sample phase when the first control signal is at the first voltage value and configured in a hold phase when the first control signal is at the second voltage value.

4. The antenna tuning circuit of claim 2, further comprising:
a first capacitor having a first terminal coupled at the second input of the operational amplifier, and a second terminal coupled at a ground terminal; and
a second capacitor having a first terminal coupled at the second input of the operational amplifier, and a second terminal coupled to receive the first control signal.

5. The antenna tuning circuit of claim 4, wherein the second capacitor is configured to:
store a voltage; and
inject stored charge at the second input of the operational amplifier when the first control signal transitions from the first voltage value to the second voltage value.

6. The antenna tuning circuit of claim 1, further comprising:
a tuning control circuit having an input coupled to the output of the operational amplifier, the tuning control circuit configured to generate the first control signal at a first output based on the output signal of the operational amplifier.

7. The antenna tuning circuit of claim 6, wherein the tuning control circuit is further configured to generate a second control signal at a second output based on the output signal of the operational amplifier, the second control signal configured for adjustment of impedance at the antenna terminal.

8. The antenna tuning circuit of claim 7, further comprising:
a matching network coupled to the antenna terminal, the matching network configured to adjust impedance at the antenna terminal in response to the second control signal.

9. The antenna tuning circuit of claim 1, wherein the output signal at the output of the operational amplifier is characterized as logically invalid when the first control signal is at the first voltage value.

10. A method comprising:
tracking an envelope of a radio frequency signal received at an antenna terminal to produce a first signal;
sampling a first voltage of the first signal by way of an operational amplifier in a first configuration;
comparing the first voltage of the first signal with a reference voltage by way of the operational amplifier in a second configuration; and
adjusting impedance at the antenna terminal based on the comparison of the first voltage of the first signal with the reference voltage.

11. The method of claim 10, further comprising:
generating a first control signal based on an output logic value of the operational amplifier in the second configuration, the impedance at the antenna terminal adjusted by way of the first control signal.

12. The method of claim 10, further comprising:
controlling a switch by way of a second control signal, the operational amplifier configured in the first configuration in response to the second control signal at a first state and in the second configuration in response to the second control signal at a second state.

13. The method of claim 10, wherein the first configuration of the operational amplifier is characterized as a follower configuration and the second configuration of the operational amplifier is characterized as a comparator configuration.

14. The method of claim 10, further comprising:
storing the first voltage by way of a first capacitor coupled at a first input of the operational amplifier in the first configuration; and
injecting stored charge corresponding to an offset voltage by way of a second capacitor coupled at the first input of the operational amplifier in the second configuration.

15. The method of claim 14, wherein the offset voltage is proportional to the ratio of the second capacitor capacitance to the first capacitor capacitance.

16. An antenna tuning circuit for radio frequency identification (RFID) transponders, the antenna tuning circuit comprising:
an envelope detector having an input coupled to an antenna terminal, the envelope detector configured to track an envelope of a signal received at the antenna terminal, the envelope detector having an output for providing a first signal;
an operational amplifier having a first input coupled to the output of the envelope detector to receive the first signal and a second input coupled to receive a second signal, the operational amplifier configured to generate an output signal at an output based on the first signal and the second signal;
a switch having a first terminal coupled to the output of the operational amplifier, a second terminal coupled to the second input of the operational amplifier, and a control terminal coupled to receive a first control signal, wherein the operational amplifier is configured in a follower configuration when the first control signal is at a first voltage value and configured in a comparator configuration when the first control signal is at a second voltage value; and
a tuning control circuit having an input coupled to the output of the operational amplifier, the tuning control circuit configured to generate the first control signal at a first output based on the output signal of the operational amplifier.

17. The antenna tuning circuit of claim 16, wherein the tuning control circuit is further configured to generate a second control signal at a second output based on the output signal of the operational amplifier, the second control signal configured for adjustment of impedance at the antenna terminal.

18. The antenna tuning circuit of claim 16, wherein the antenna tuning circuit is configured in a sample phase when the first control signal is at the first voltage value and configured in a hold phase when the first control signal is at the second voltage value.

19. The antenna tuning circuit of claim 16, further comprising:
 a first capacitor having a first terminal coupled at the second input of the operational amplifier, and a second terminal coupled at a ground terminal; and
 a second capacitor having a first terminal coupled at the second input of the operational amplifier, and a second terminal coupled to receive the first control signal.

20. The antenna tuning circuit of claim 19, wherein the second capacitor is configured to:
 store a voltage; and
 inject stored charge at the second input of the operational amplifier when the first control signal transitions from the first voltage value to the second voltage value.

\* \* \* \* \*